United States Patent
Doerr et al.

(10) Patent No.: US 7,473,846 B2
(45) Date of Patent: Jan. 6, 2009

(54) REVERSIBLE CABLE SUPPORT ARM

(75) Inventors: Alan B. Doerr, Houston, TX (US);
Minh H. Nguyen, Houston, TX (US);
Kelly K. Smith, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 350 days.

(21) Appl. No.: 11/392,113

(22) Filed: Mar. 29, 2006

(65) Prior Publication Data
US 2007/0227756 A1 Oct. 4, 2007

(51) Int. Cl.
H01B 7/06 (2006.01)

(52) U.S. Cl. ............ 174/69; 174/68.3; 174/72 A; 174/99 E; 361/826; 211/26; 248/244

(58) Field of Classification Search .......... 174/69, 174/68.3, 72 A, 99 E; 361/825–829; 312/294, 312/223.1; 211/26, 183, 189, 190; 248/244, 248/221.11; 403/322.4
See application file for complete search history.

(56) References Cited

U.S. PATENT DOCUMENTS

| | | | |
|---|---|---|---|
| 3,710,199 A | 1/1973 | Cignoni, Jr. | |
| 4,614,383 A | 9/1986 | Polley et al. | |
| 6,021,047 A | 2/2000 | Lopez et al. | |
| 6,021,909 A | 2/2000 | Tang et al. | |
| 6,070,742 A | 6/2000 | McAnally et al. | |
| 6,269,959 B1 | 8/2001 | Haworth | |
| 6,303,864 B1 * | 10/2001 | Johnson et al. | 174/69 |
| 6,305,556 B1 | 10/2001 | Mayer | |
| 6,326,547 B1 | 12/2001 | Saxby et al. | |
| 6,327,139 B1 | 12/2001 | Champion et al. | |
| 6,435,354 B1 | 8/2002 | Gray et al. | |
| 6,442,030 B1 | 8/2002 | Mammoser et al. | |
| 6,523,918 B1 | 2/2003 | Baiza | |
| 6,578,939 B1 | 6/2003 | Mayer | |
| 6,583,985 B2 | 6/2003 | Nguyen et al. | |
| 6,603,661 B2 | 8/2003 | Smith et al. | |
| 6,654,239 B2 | 11/2003 | Smith | |
| 6,655,534 B2 | 12/2003 | Williams et al. | |
| 6,657,867 B2 | 12/2003 | Smith | |
| 6,669,423 B2 | 12/2003 | Smith | |
| 6,693,798 B1 | 2/2004 | Conn et al. | |
| 6,702,412 B2 | 3/2004 | Dobler et al. | |
| 6,717,806 B2 | 4/2004 | Nguyen et al. | |
| 6,856,514 B2 | 2/2005 | Smith | |
| 6,860,747 B2 | 3/2005 | Nguyen | |
| 6,882,540 B2 | 4/2005 | Conn et al. | |
| 7,023,708 B2 * | 4/2006 | Nguyen et al. | 361/810 |
| 7,281,694 B2 * | 10/2007 | Allen et al. | 248/244 |
| 7,317,623 B2 * | 1/2008 | Nguyen et al. | 361/826 |
| 2004/0086332 A1 | 5/2004 | Smith | |
| 2004/0120134 A1 | 6/2004 | Nguyen et al. | |

* cited by examiner

Primary Examiner—Dhiru R Patel (57) ABSTRACT

A cable support arm is provided. In one embodiment, the cable support arm includes first and second arm sections that are rotatably coupled one over the other at a hinge structure. In this embodiment, the first and second arm sections include attachment mechanisms configured to couple the arm sections to a respective housing and device. One of the attachment mechanisms of this embodiment may include a mounting base and a mounting bracket that is reversibly coupleable to the mounting base to enable ambidextrous mounting of one of the arm sections to the device.

23 Claims, 9 Drawing Sheets

REVERSIBLE CABLE SUPPORT ARM

BACKGROUND

This section is intended to introduce the reader to various aspects of art, which may be related to various aspects of the present subject matter described and/or claimed below. The discussion is believed to be helpful in providing the reader with background information to facilitate a better understanding of the various aspects of the present subject matter. Accordingly, it should be understood that these statements are to be read in this light, and not as admissions of prior art.

Rack systems, such as rack mount server systems, generally include a number of rack spaces for receiving and securing a variety of rack mountable devices, such as computing servers, interface devices, and the like. These rack mountable devices often include cables, such as cables that provide power to the device or that facilitate communication with other devices or systems. These cables may be routed to other devices or components within the rack system, or may be routed to other devices external to the rack system. Such cables consume considerable space within the rack systems and may present a host of other technical constraints, including restricting movement of the rack mountable devices, limiting the mounting depth of the rack mountable devices, and complicating rear access to the rack mountable devices, for instance.

Various cable management schemes have been previously employed in such rack systems, including the use of cable management arms. Typically, these cable management arms are configured to mount to one side of a particular rack system and route cables along the cable arms and the side of the rack system to which the arms are mounted. Because all of the cables in these rack systems are routed along the same side of the system, such cable management arms result in overcrowding along one side of the rack system and pose technical constraints similar to those noted above.

BRIEF DESCRIPTION OF THE DRAWINGS

Advantages of one or more disclosed embodiments may become apparent upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in greater detail below, one or more embodiments of the present techniques provide a novel system and device for routing one or more cables associated with a device mounted within a rack system. In one embodiment, a reversible cable support arm is configured for ambidextrous mounting to either of the left or right sides of a rack structure to route one or more cables from a rack mounted device, along the cable support arm, and along the side of the structure to which the arm is mounted. However, upon reading the following description, it will be apparent that the present techniques may be generally used to route one or more cables, cords, or hoses of a variety of components in a movable or stationary relationship with respect to a rack system or enclosure. Further, these cables, cords, or hoses, could include one or more of a wide array of such items, including power cords or cables, network cables, other communication cables, coolant hoses, or the like.

Figure 1:
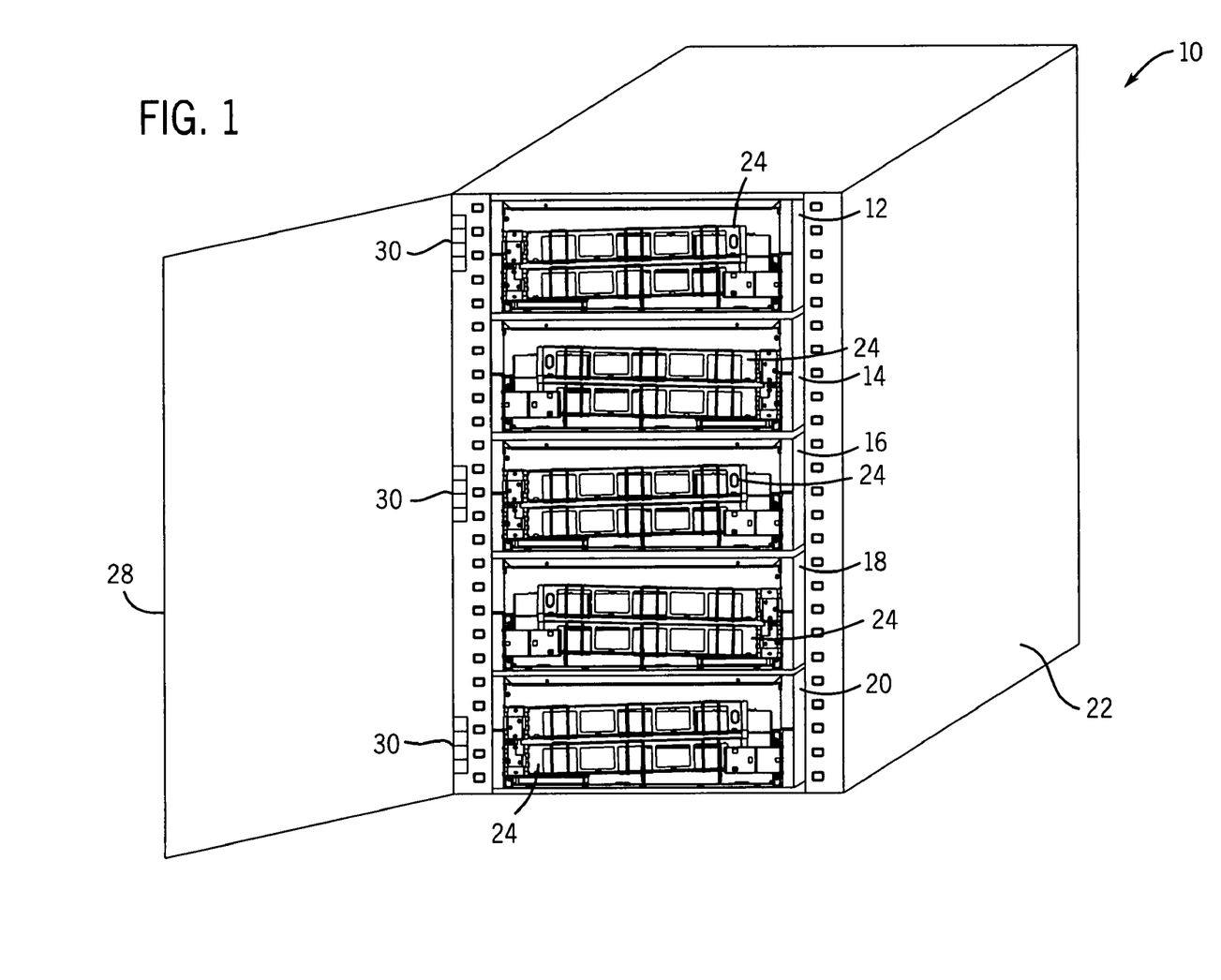
FIG. 1 is a perspective view illustrating a rack mount system having ambidextrous cable support arms in accordance with one embodiment of the present invention.

Turning now to the figures, an exemplary rack mount system 10 is illustrated in FIG. 1 in accordance with one embodiment of the present invention. In the illustrated embodiment, rack mount system 10 includes a number of rack mounted components or devices 12, 14, 16, 18, and 20, which are disposed in a rack housing, enclosure, or structure 22. As will be appreciated, the rack mounted components or devices 12-20 may include various computing components, such as a rack mountable server. However, the rack mounted devices 12-20 may also include other, non-computing components in full accordance with the present techniques. The rack housing 22 may have any number and configuration of rack mount receptacles having supports, such a manual or automatic rail mechanisms, that support the rack mounted devices 12-20 movably within the rack housing 22. While devices 12-20 may be substantially similar in size, as illustrated in the present embodiment, it should be noted that rack housing 22 may be configured to receive various components of differing sizes in accordance with the present techniques.

In the present embodiment, the rack mount system 10 includes a plurality of cable support arms 24 that are configured to route cables 26 (see FIG. 2) from the rack mounted devices 12-20. The cable support arms 24 may be rotatably coupled to the rack housing 22 and to a respective rack mounted device 12-20. As discussed in greater detail below, the cable support arms 24 are configured to enable ambidextrous mounting to either the left side or the right side of rack housing 22. Such ambidextrous mounting facilitates convenient routing of the various cables 26 along either or both sides of the housing 22.

Further, in one embodiment, the cable support arms 24 are configured to rotate outwardly from the rack mounted components 12-20 to provide ease of access to such components, allowing for easier connecting or disconnecting of various cables 26 to or from the components 12-20, for example. The exemplary system 10 includes a rear access door 28 coupled to the housing 22 via one or more hinges 30. The cable support arms 24 may also extend inwardly into the housing 22 as a respective device of rack mounted devices 12-20 is extracted from the housing 22.

Figure 2:
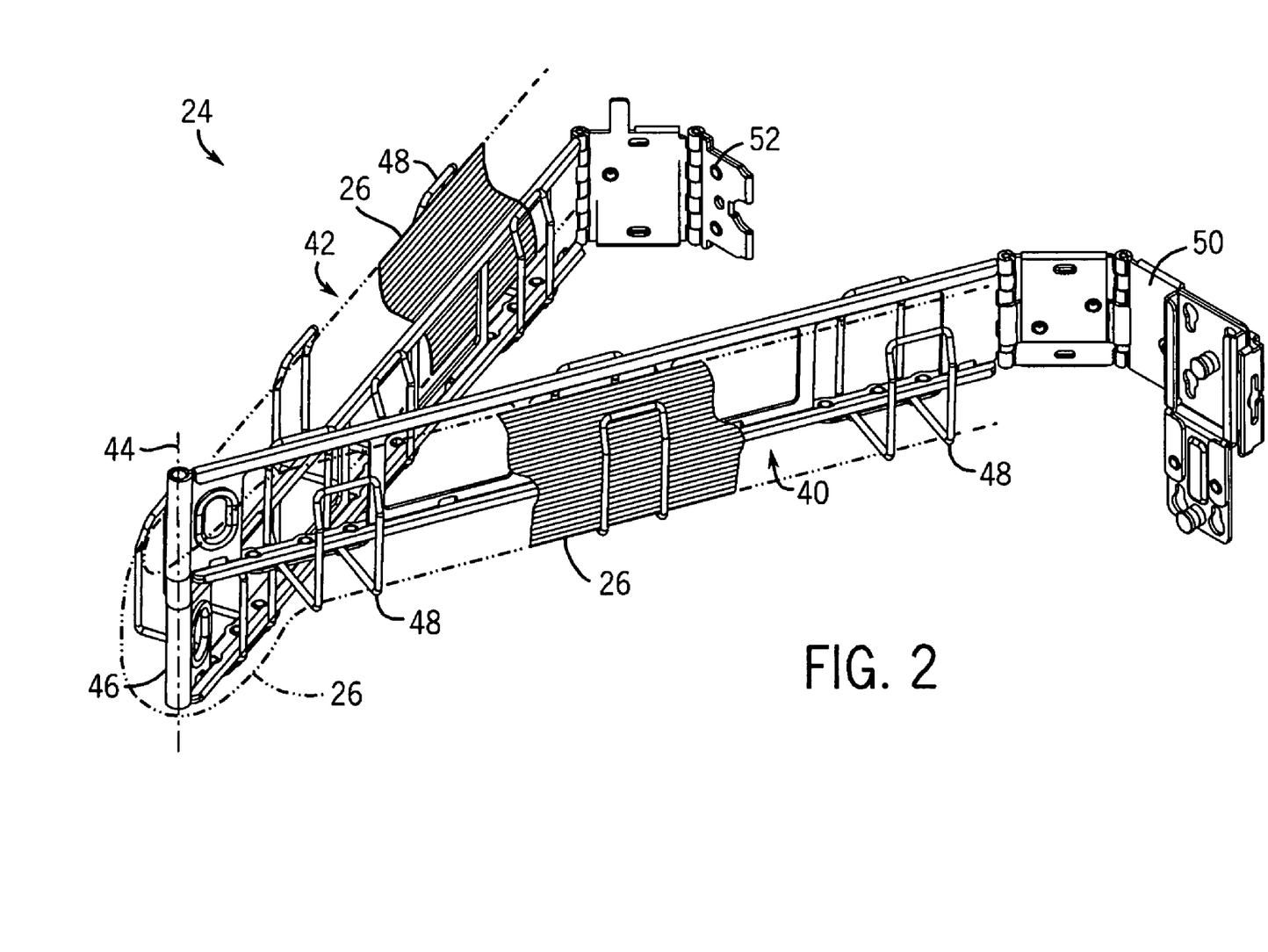
FIG. 2 is a perspective view of one of the ambidextrous cable support arms depicted in FIG. 1, illustrating certain features of the cable support arm in accordance with one embodiment of the present invention.

An exemplary embodiment of cable support arm 24 is depicted in FIG. 2. In this embodiment, the cable support arm 24 includes a pair of arm sections 40 and 42 that are rotatably coupled in a stacked configuration, along a rotational axis 44, via hinge 46. The hinge 46 may be any of a number of pivot mechanisms, including a pivot joint, a multi-joint hinge, or the like. This stacked arrangement enables rotation of arm sections 40 and 42 with respect to one another about the hinge 46. In certain embodiments, the arm sections 40 and 42 and the hinge 46 are configured to permit full circular motion, or substantially full circular motion, of arm section 40 with respect to arm section 42, allowing the cable support arm 24 to be oriented for mounting to either side of a rack mount system 10.

The cable support arm 24 includes one or more cable support features 48, such as the presently illustrated cable support brackets, for supporting and routing cables 26, which are shown partially in phantom in FIG. 2 for the sake of clarity. For example, in certain embodiments, the cable support features 48 may have a variety of hook-shaped geometries or configurations, such as a U-shaped or an L-shaped geometry, for instance. It should be noted, however, that the cable support features 48 may include a variety of other attachment mechanisms such as Velcro, elastic, or snap-fit straps, for instance, in addition to, or instead of, cable support brackets. In one embodiment, these cable support features 48 facilitate routing of cables from one of the devices 12-20 along the arm section 40, around the hinge 46, and along the arm section 42. As discussed below, these cable support features 48 also may be reversed from one side to another of the cable support arm 24, thereby facilitating reversible mounting of the arm 24 to either the left or the right side of the rack mount system 10.

The exemplary cable support arm 24 also includes attachment mechanisms or assemblies 50 and 52 to facilitate coupling of arm sections 40 and 42, respectively, to the rack mount system 10. While the attachment mechanisms 50 and 52 of the present embodiment are tool-free attachment mechanisms, as discussed in detail below, other embodiments may include attachment mechanisms that employ other mounting structures, such as a threaded fastener, a latch mechanism, or some other coupling mechanism. In one embodiment, the various elements of the cable support arm 24 are formed from metal. However, one or more of these elements, or even all of these elements, could be formed from other suitable materials, such as plastic, in accordance with the present techniques.

Figure 3:
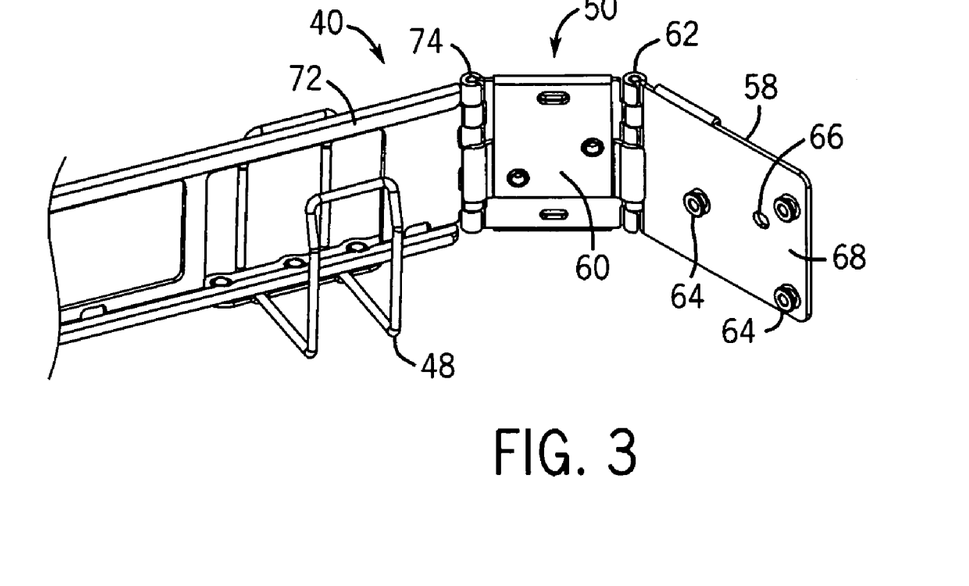
FIG. 3 is a front perspective view of a portion of the upper arm of the cable support arm provided in FIG. 2 as well as a base portion of an attachment mechanism for coupling the upper arm to a movable component in accordance with one embodiment of the present invention.
Figure 4:
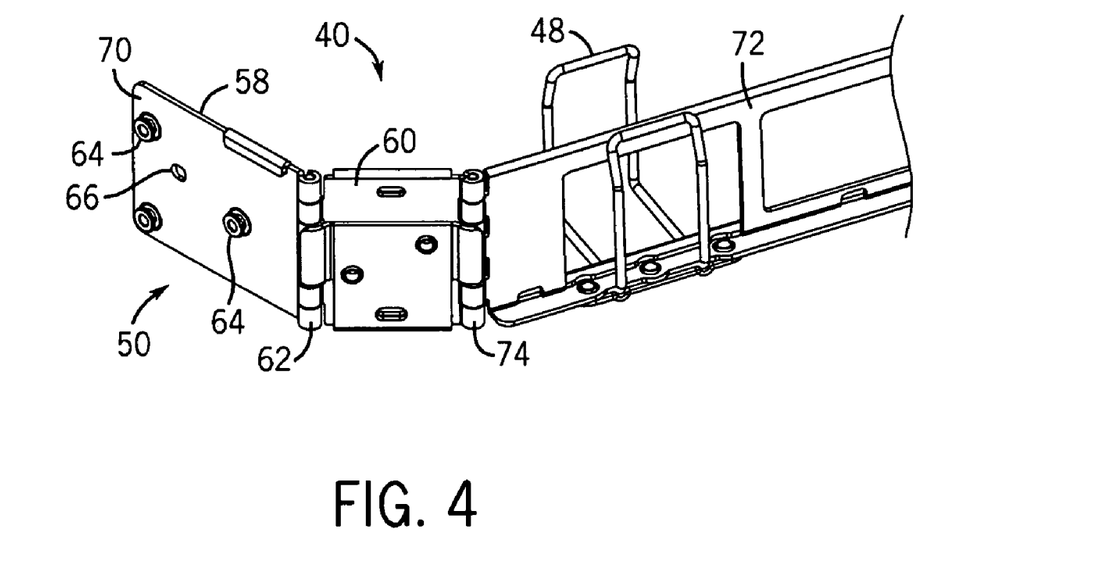
FIG. 4 is a rear perspective view of the portions of the upper arm and attachment mechanism illustrated in FIG. 3.

Additional features of the attachment mechanism 50 will be more clearly understood with reference to FIGS. 3-6. Particularly, FIGS. 3 and 4 illustrate front and rear perspective views of a portion of the attachment mechanism 50 coupled to arm section 40. As illustrated in these two figures, the attachment mechanism 50 includes a base mounting portion 58 coupled to an extension element or portion 60 via a hinge 62. The base mounting portion 58 includes one or more alignment or securing features, such as boss members 64 and aperture 66.

In the present exemplary embodiment, boss members 64 are disposed on both a front side 68 and a rear side 70 of the base mounting portion 58 in a symmetrical fashion. It should be noted that other embodiments may include boss members 64 that are not disposed symmetrically about base mounting portion 58, may include other securing features in addition to or in place of the boss members 64 and the aperture 66, and that such securing features may be disposed on just one side, or on both sides, of the base portion 58. However, the symmetrical arrangement of the boss members 64 and the aperture 66 facilitates reversible mounting of the attachment mechanism 50, and similarly attachment mechanism 52, to either the left or right side of the rack mount system 10.

The attachment mechanism 50 is coupled to a portion 72 of the arm section 40 via a hinge 74. As noted above with respect to hinge 46, hinges 62 and 74 may include various elements or structures that facilitate rotation of one member with respect to another about a common axis.

Figure 5:
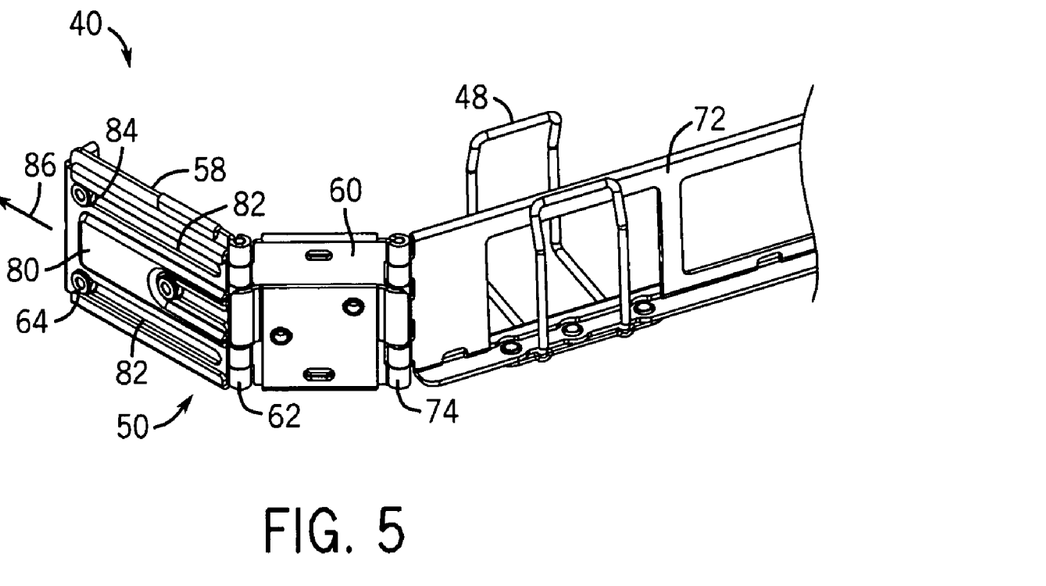
FIG. 5 is a rear perspective view illustrating the attachment of a rear mounting bracket to the assembly illustrated in FIG. 4 in accordance with one embodiment of the present invention.
Figure 6:
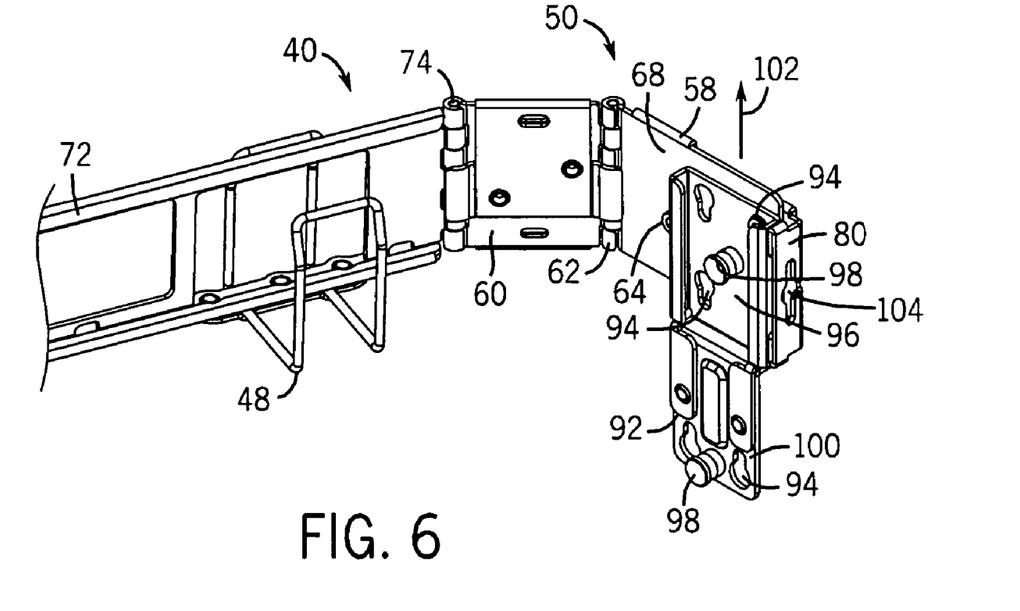
FIG. 6 is a front perspective view illustrating the attachment of a front mounting bracket to the assembly illustrated in FIG. 5 in accordance with one embodiment of the present invention.

One or more mounting brackets may be coupled to the base mounting portion 58 to facilitate coupling of the attachment mechanism 50 to a device, such as the rack mounted device 12, as illustrated in FIGS. 5 and 6. Specifically, in the exemplary embodiment of FIG. 5, a mounting bracket 80 is configured for tool-free coupling to one side of the base mounting portion 58. The mounting bracket 80 includes keyhole slots 82 formed in the bracket. The enlarged ends 84 of the slots 82 are configured to receive respective boss members 64 disposed on either of sides 68 or 70.

Once fit over the respective boss members 64, the mounting bracket 80 may be secured to the base portion 58 by sliding the bracket 80 in the direction indicated by arrow 86. As will be appreciated, the cooperation between the boss members 64 and the portions of the bracket 80 adjacent the narrow ends of keyhole slot 84 secures the bracket 80 to the base portion 58. Once assembled, the mounting bracket 80 may be removed by sliding bracket 80 in a direction opposite that indicated by arrow 86, such that the enlarged ends 84 of the slots 82 may slip off of the boss members 64. It should be noted that, in one embodiment, a second mounting bracket 92 (see FIG. 6) is configured to further secure mounting bracket 80 to the base mounting portion 58 by preventing the mounting bracket 80 from sliding into a position in which the slots 82 can be slipped over the respective boss members 64.

As illustrated in FIG. 6 and noted above, the second mounting bracket 92 may be secured to the assembly discussed with respect to FIG. 5. In the present embodiment, the exemplary mounting bracket 92 includes a number of keyhole slots 94 provided in an upper portion 96 of the bracket 92. The upper portion 96 of the bracket 92 also includes a plunger 98, which may be a spring plunger, a ball plunger, or the like. A lower portion 100 of the exemplary mounting bracket 92 also includes keyhole slots 94 and a plunger 98.

In the presently illustrated embodiment, the mounting bracket 92 may be coupled to the base mounting portion 58 on a side opposite the mounting bracket 80, such as side 68. One or more of the keyhole slots 94 cooperate with boss members 64 disposed on the side 68 of the base portion 58 (see FIG. 4) to secure the mounting bracket 92 to the base portion 58. Particularly, in the present embodiment, one or more keyhole slots 94 are slipped over respective boss members 64 and the mounting bracket is moved upwardly in the direction indicated by arrow 102. As the mounting bracket 92 is moved in this direction, the plunger 98 of the upper portion 96 engages the aperture 66 of base mounting portion 58 (see FIG.3), thereby securing the mounting bracket 92 to the base mounting portion 58. The mounting bracket 92 may be uncoupled from the base portion 58 by disengaging the plunger 98 of the upper portion 96 and sliding the bracket 92 in the direction opposite that of arrow 102. Additionally, as discussed below, the lower portion 100 of bracket 92, and a slot 104 formed in the bracket 80, may facilitate securing of the cable support arm 24 to a device or rail disposed within a rack system.

Figure 7:
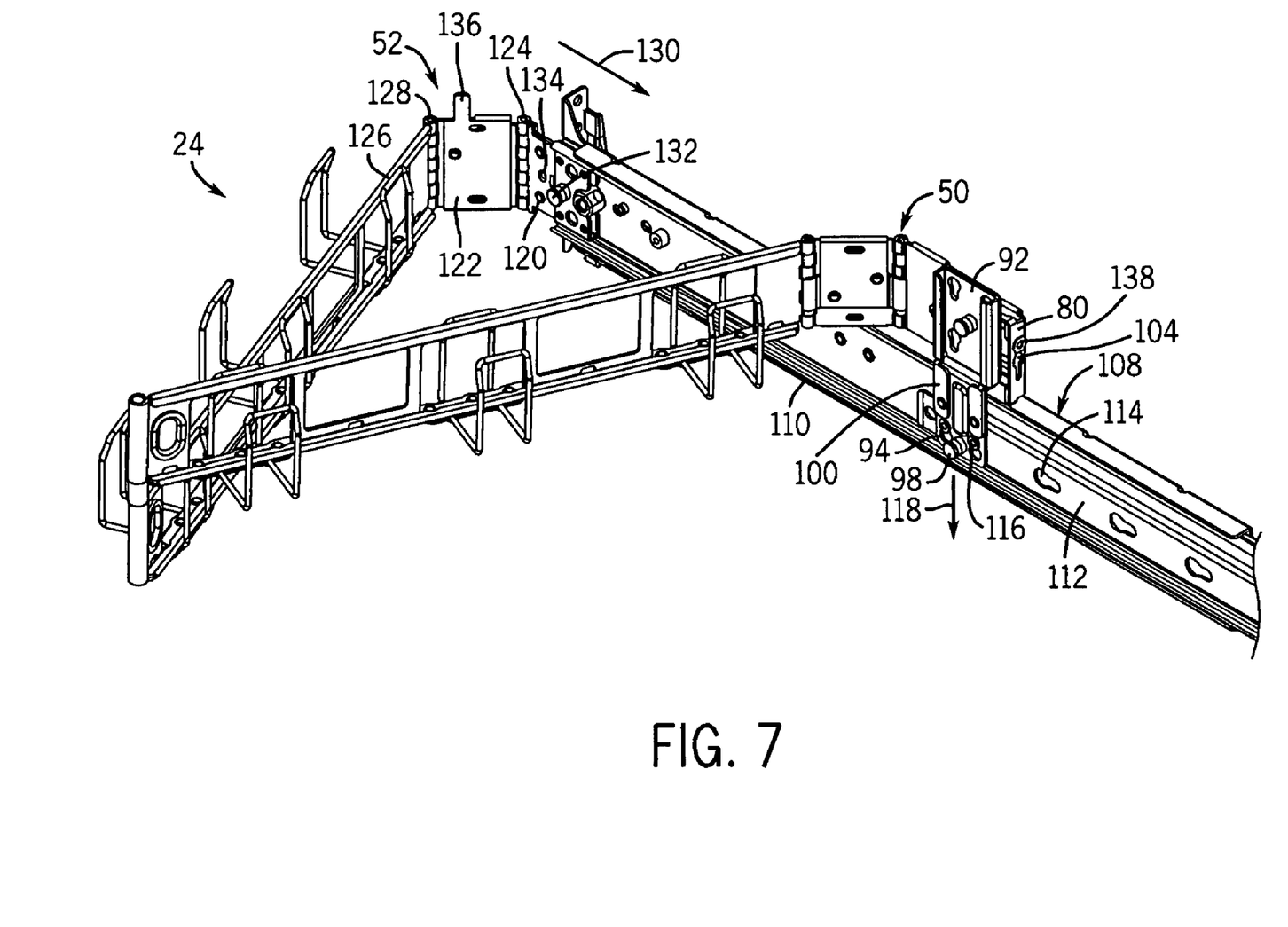
FIG. 7 is a front perspective view illustrating the attachment of the cable support arm of FIG. 2 to a rail of a rack mount system in accordance with one embodiment of the present invention.

The cable support arm 24 may be attached to a rail 108, as illustrated in FIG. 7. As will be appreciated, one or more rails 108 may be installed within a rack system, such as rack mount system 10. The exemplary rail 108 includes an outer slide member 110 and an inner slide member 112, which are configured to allow the two members to slide with respect to one another. In the present embodiment, the inner slide member 112 includes a plurality of device mounting features 114 that facilitate mounting of a device, such as any of the rack mounted devices 12-20, to the rail 108.

The inner slide member 112 also includes one or more boss members 116 and an aperture that cooperate with the keyhole slots 94 and plunger 98 of the lower portion 100 of the mounting bracket 92 to couple the mounting bracket 92 to the inner slide member 112. The cable support arm 24 is secured to the inner slide member 112 by fitting one or more keyhole slots 94 of the mounting bracket 92 over the boss members 116 and moving the bracket 92 in the direction indicated by arrow 118. This movement causes the plunger 98 on the lower portion 100 of the bracket 92 to engage the aperture of the inner slide member, thus securing the mounting bracket 92 to the rail 108 in a manner similar to that of the coupling of the mounting bracket 92 to the base mounting portion 58. Likewise, the mounting bracket 92 may be disassembled from the rail 108 by disengaging the plunger 98 of the lower portion 100 and sliding the bracket in the direction opposite arrow 118.

Figure 9:
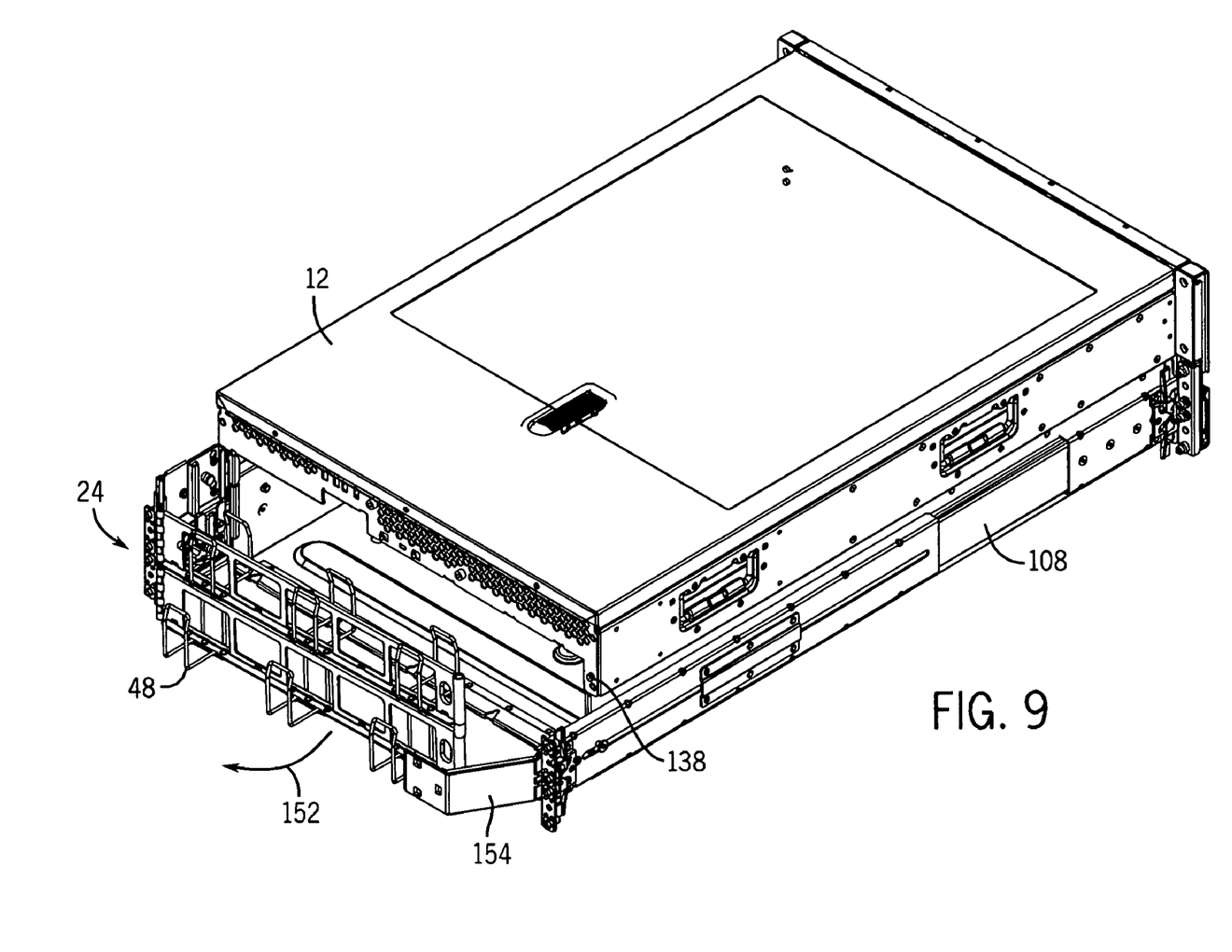
FIG. 9 a perspective view of the cable support arm of FIG. 2 mounted to a left rail of a rack mount system in accordance with one embodiment of the present invention.
Figure 10:
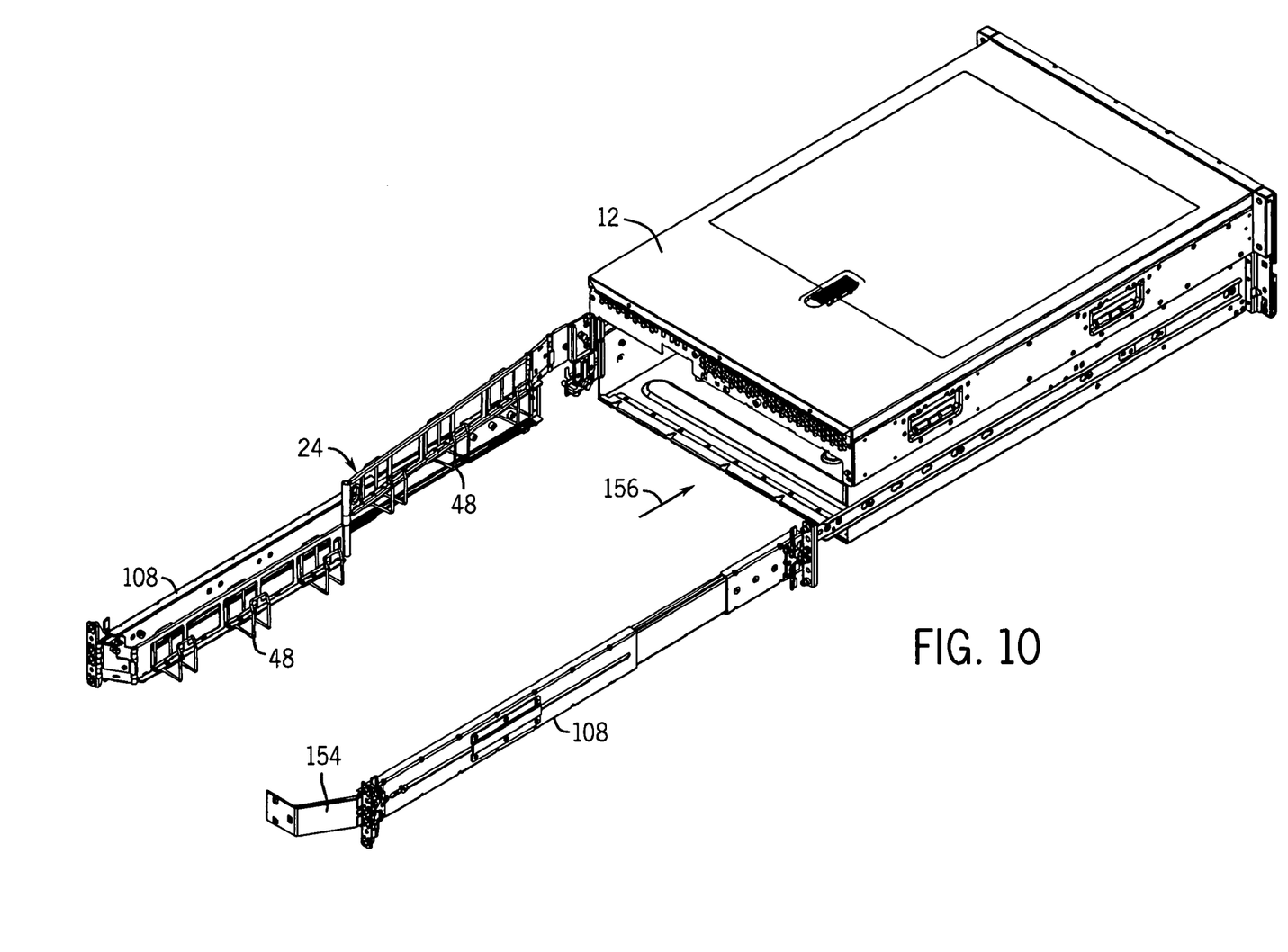
FIG. 10 is a perspective view illustrating the extension of the cable support arm of FIG. 9 upon movement of a component coupled between two rails of a rack mount system in accordance with one embodiment of the present invention.
Figure 11:
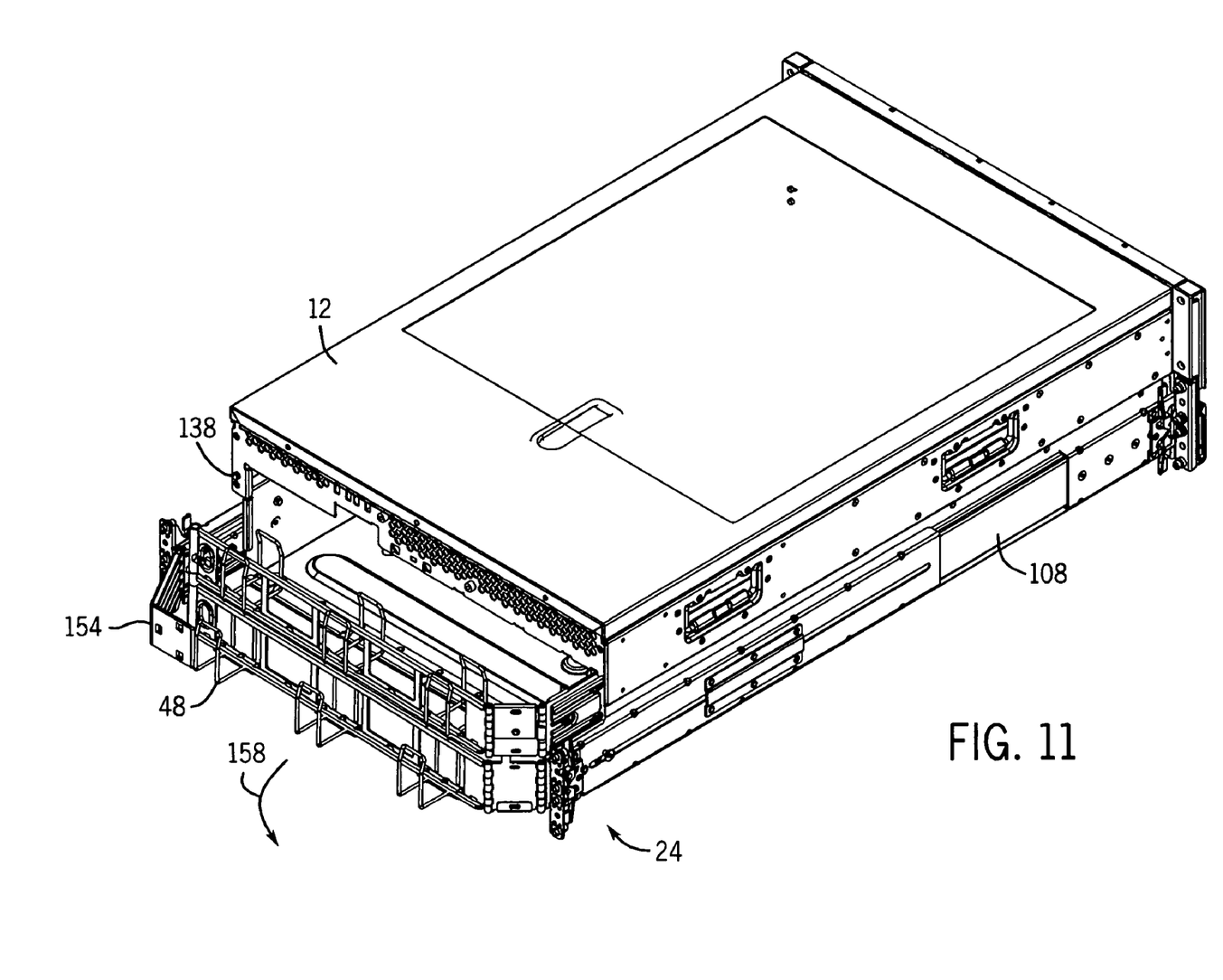
FIG. 11 is a perspective view of the cable support arm of FIG. 2 mounted to a right rail of a rack mount system in accordance with one embodiment of the present invention.

In one embodiment, the slot 104 of mounting bracket 80 is also configured to receive a boss member 138 of a device mounted to the rail 108, such as device 12 (see FIGS. 9-11). In such an embodiment, movement of the attachment mechanism 50 in the direction indicated by arrow 118 causes the boss member 138 to be positioned at a narrower portion of the slot 104, thus securing the mounting bracket 80 directly to the rail-mounted device.

The other end of the cable support arm 24 may be secured to the outer slide member 110 via the attachment mechanism 52. In the present exemplary embodiment, the attachment mechanism 52 includes a securing portion 120 coupled to an extension 122 via a hinge 124. The attachment portion 52, in turn, is coupled to a portion 126 of the cable support arm 24 via a hinge 128. These hinges 124 and 128 may include any of a number of suitable structures that enable rotation of one element with respect to another about a common axis of rotation. The attachment portion 52 is secured to the outer slide member 110 by moving the attachment mechanism 52 in the direction indicated by arrow 130. As the attachment mechanism 52 is moved in this direction, a plunger 132 disposed on the outer slide member 110 engages an aperture 134 of the securing portion 120 to secure the cable support arm 24 to the rail 108. To uncouple the cable support arm 24, the plunger 132 may be disengaged and the attachment mechanism 52 may be moved in the direction opposite from that of arrow 130. The securing mechanism 52 may also include an extended portion or tab 136 that prevents rotation of the two arm sections of cable support arm 24 past one another.

Figure 8:
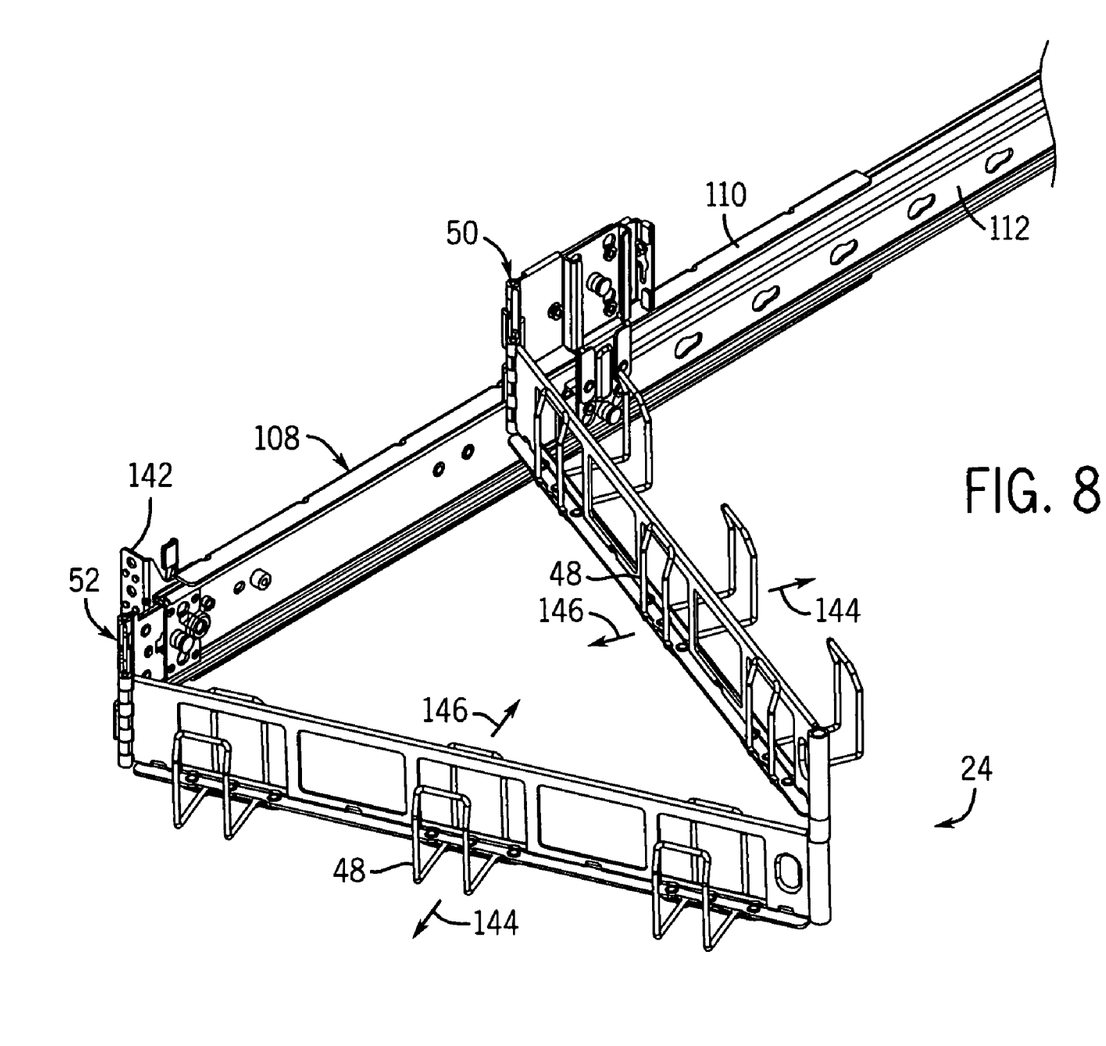
FIG. 8 is a rear perspective view of the cable support arm and rail provided in FIG. 7, which further illustrates certain features of cable support brackets coupled to the cable support arm in accordance with one embodiment of the present invention.

Additional features of the exemplary cable support arm 24 and rail 108 are depicted in FIG. 8. The exemplary rail 108 includes a mounting bracket 142 that facilitates installation of the rail 108 in a rack system, such as rack mount system 10. To facilitate ambidextrous mounting, the cable support features 48 of the instant embodiment are reversible. Particularly, when installed on the left side of a system 10, such as the orientation illustrated in FIG. 8, the cable support features 48 may be moved to a first position by sliding the cable support features 48 in a direction corresponding with arrow 144. However, the arm sections of the cable support arm 24 may be reversed and mounted on the right side of a system (see FIG. 11). In this case, the cable support features 48 may be moved to a second position by sliding the cable support features 48 in a direction noted by arrow 146, opposite the direction of arrow 144. As illustrated, the exemplary cable support features 48 have a generally U-shaped geometry, wherein a base of the U-shaped geometry slides crosswise relative to the cable support arm 24, as illustrated by arrows 144 and 146. Thus, an L-shaped portion of the U-shaped geometry is positioned on either side of the cable support arm 24, depending on the desired configuration.

It should be noted that, while particular attachment mechanisms have been described with respect to one exemplary embodiment, other embodiments may employ any suitable latching and fastening mechanisms in accordance with the present techniques. Such alternative attachment mechanisms may have certain fastening and mounting features provided to accommodate rack structures of a particular configuration or mounting type. Accordingly, the cable support arm 24 or rails 108 may be mounted to a variety of different types of rack structures.

As noted above, the exemplary cable support arm 24 may be mounted to either side of a rack system, accommodates movement of an attached device, and facilitates access to such a device. For instance, in FIGS. 9-11, the cable support arm 24 is coupled to the device 12 within the rack system 10. For the sake of clarity, the system 10 has been removed from these figures to more clearly demonstrate additional features of the cable support arm 24.

In FIG. 9, the cable support arm 12 is oriented for mounting to the left side of the system 10 and the device 12 is retracted between the rails 108. The cable support arm 24 is in a closed position and is located at the rear of the rack mounted device 12. While mounted to the left side of system 10 and positioned in its retracted orientation, the cable support arm 24 may be rotated outwardly from the device 12, in the direction indicated by arrow 152, to facilitate access to the rear portion of device 12. A retaining bracket 154 may be removably coupled to a side of the system 10 opposite the cable support arm 24 to prevent rotation of the cable support arm 24 away from the device 12. In one embodiment, the retaining bracket 154 includes a securing portion identical or similar to that of attachment mechanism 52 and is configured to be mounted to the rail 108 in an identical or similar manner to facilitate convenient installation and removal of the retaining bracket 154.

The cable support arm 24 may extend within the housing 22 as the device 12 is extended therefrom, as illustrated in FIG. 10. As the device 12 is removed from the housing 22 as indicated by arrow 156, the cable support arm 24 extends inwardly into the housing 22. Conversely, the cable support arm 24 contracts as the device 12 is inserted into the housing 22 in the direction opposite arrow 156. Throughout this range of motion, the cable support features continue to route associated cables 26 from the device 12. Accordingly, an operator may extend the device 12 from the housing 22 to access the device without disconnecting the cables 26.

Finally, the exemplary cable support arm 24 is reversible for ambidextrous mounting, and may be reoriented for mounting to the right side of the system 10 instead of the left side, as depicted in FIG. 11. In the presently illustrated embodiment, the symmetry of boss members 64 facilitates reversal of each of the mounting brackets 80 and 92 from respective sides 68 and 70 of the base mounting plate 58 to the opposite sides. Each arm section 40 and 42 may also be rotated about the hinge 46 to move from the generally V-shaped orientation illustrated in FIG. 9 for left-side mounting, to an opposite V-shaped orientation presently illustrated in FIG. 11 for right-side mounting. The reversal of the mounting brackets 80 and 92, and the rotation of the arm sections 40 and 42, allows the arm section 40 to be coupled via attachment mechanism 50 to the inner slide member 112 of a rail 108 provided on either side of the rack mount system 10. Similarly, the arm section 42 may be coupled to the outer slide member 110 of either a left or a right rail 108 via attachment mechanism 52.

Further, in one embodiment, to facilitate right-side mounting, the cable support features 48 are slid into a second position opposite the cable support arm from a first position corresponding to the left-side mounting discussed above and as discussed with respect to FIG. 8. In this arrangement, the retaining bracket 154 may be mounted to the left side of the system 10, opposite the cable support arm 24. When mounted to the right side of the system 10, the cable support arm 24 may be rotated outwardly from the device 12 in the direction indicated by arrow 158, and may likewise extend inwardly into the housing 22 as the device 12 is extracted from the housing 22.

What is claimed is:

1. A cable support arm comprising:
a first arm section having a first attachment mechanism configured to couple the first arm section to a housing;
a second arm section having a second attachment mechanism configured to couple the second arm section to a device mounted within the housing, wherein the first and second arm sections are rotatably coupled one over the other via a hinge structure, the second attachment mechanism comprising:
a mounting base coupled to the second arm section, the mounting base having at least one alignment feature; and
a mounting bracket configured to be coupled to the device and configured to cooperate with the at least one alignment feature of the mounting base to reversibly couple the mounting bracket to either of a first or a second side of the mounting base to enable ambidextrous mounting of the second arm to the device; and
a plurality of cable support features coupled to the first and second arm sections.

2. The cable support arm of claim 1, wherein the plurality of cable support features comprise a plurality of cable support brackets that are movably coupled to the first and second arm sections, wherein each of the plurality of cable support brackets is configured to be selectively oriented in either of a first position in which a first portion of the cable support bracket extends from a first side of the first or second arm section or a second position in which a second portion of the cable support bracket extends from a second side of the first or second arm section opposite the first side of the first or second arm section.

3. The cable support arm of claim 2, wherein the first and second arm sections and the cable support brackets are configured to facilitate sliding of each cable support bracket in either of two opposite directions substantially orthogonal to the length of the first or second arm section to which each cable support bracket is respectively coupled.

4. The cable support arm of claim 1, wherein the at least one alignment feature comprises a first boss member disposed on the first side of the mounting base and the mounting bracket comprises a first keyhole slot configured to receive the first boss member.

5. The cable support arm of claim 4, wherein the mounting bracket comprises a locking feature configured to cooperate with a mating feature of the mounting base.

6. The cable support arm of claim 5, wherein the locking feature is a plunger and the mating feature is an aperture configured to receive an end of the plunger.

7. The cable support arm of claim 4, wherein the at least one alignment feature comprises a second boss member disposed on the second side of the mounting base.

8. The cable support arm of claim 7, wherein the first keyhole slot is configured to receive the second boss member.

9. The cable support arm of claim 7, wherein the mounting bracket comprises a second keyhole slot configured to receive the second boss member.

10. The cable support arm of claim 1, wherein the mounting bracket is configured to be coupled to the device via an inner slide member of a rail disposed within the housing.

11. The cable support arm of claim 1, wherein the second attachment mechanism comprises an additional bracket that is configured to be reversibly coupled to either of the first or second sides of the mounting base opposite the mounting bracket.

12. The cable support arm of claim 11, wherein the additional bracket is configured to be directly coupled to the device.

13. A cable support arm comprising:
a first arm section;
a second arm section movably coupled to the first arm section in a stacked arrangement by a hinge structure, wherein the first and second arm sections and the hinge structure are configured such that each of the first and second arm sections is capable of at least substantially full circular motion with respect to the other; and
a plurality of reversible cable support brackets coupled to the first and second arm sections, wherein the reversible cable support brackets are configured to facilitate ambidextrous mounting of the first and second arm sections.

14. The cable support arm of claim 13, wherein the reversible cable support brackets are movably coupled to the first and second arm sections and are configured to be selectively oriented in a first position to facilitate routing of a cable of a component when the cable support arm is mounted to a first side of the component and in a second position to facilitate routing of the cable when the cable support arm is mounted to a second side of the component.

15. The cable support arm of claim 14, wherein at least one of the first or second arm sections comprises a reversible mounting assembly.

16. The cable support arm of claim 15, wherein the reversible mounting assembly comprises:
   a base portion coupled to the first or second arm section via a hinge, the base portion including first and second sides opposite one another, each of the first and second sides having an attachment feature; and
   a mounting bracket configured to be selectively coupled to either of the first and second sides of the base portion to facilitate coupling of the cable support arm to the first or second side of the component, respectively.

17. The cable support arm of claim 16, wherein the mounting bracket is configured to be coupled to the component via a rail.

18. A system comprising:
   a rack structure having a receptacle adapted to receive a rack mountable device;
   at least one rail mechanism coupled to the rack structure in the receptacle and configured to be coupled to the rack mountable device, the at least one rail mechanism comprising an inner slide member and an outer slide member;
   a cable support arm coupled to the at least one rail mechanism, the cable support arm including a first arm section coupled to a second arm section via a hinge, the first arm section coupled to the inner slide member and the second arm section coupled to the outer slide member; and
   a plurality of reversible cable support brackets coupled to the first and second arm sections, wherein the reversible cable support brackets are configured to facilitate ambidextrous mounting of the first and second arm sections.

19. The system of claim 18, comprising the rack mountable device, wherein the rack mountable device comprises a computing device coupled to the at least one rail mechanism.

20. The system of claim 18, wherein the at least one rail mechanism comprises first and second rail mechanisms coupled to opposite sides of the rack structure within the receptacle, the cable support arm configured to be reversibly mounted to the inner and outer slide members of either of the first and second rail mechanisms.

21. The cable support arm of claim 13, wherein the reversible cable support brackets comprise U-shaped brackets, wherein a base of each U-shaped bracket slides back and forth from one side to another of the respective first and second arm sections.

22. The system of claim 18, wherein the reversible cable support brackets comprise U-shaped brackets, wherein a base of each U-shaped bracket slides back and forth from one side to another of the respective first and second arm sections.

23. The system of claim 18, comprising:
   a mounting base coupled to the second arm section, the mounting base having at least one alignment feature; and
   a mounting bracket configured to be coupled to the rack mountable device and configured to cooperate with the at least one alignment feature of the mounting base to reversibly couple the mounting bracket to either of a first or a second side of the mounting base to enable ambidextrous mounting of the second arm to the rack mountable device.

* * * * *